United States Patent [19]

Landau

[11] Patent Number: 4,622,122

[45] Date of Patent: Nov. 11, 1986

[54] PLANAR MAGNETRON CATHODE TARGET ASSEMBLY

[75] Inventor: Richard F. Landau, Londonderry, N.H.

[73] Assignee: Oerlikon Buhrle U.S.A. Inc., New York, N.Y.

[21] Appl. No.: 832,082

[22] Filed: Feb. 24, 1986

[51] Int. Cl.[4] .............................................. C23C 15/00
[52] U.S. Cl. ................................ 204/298; 204/192.12; 204/192.2
[58] Field of Search ............... 204/298, 192 M, 192 R

[56] References Cited

U.S. PATENT DOCUMENTS

| 4,049,761 | 6/1978 | Wilson | 204/192 M |
|---|---|---|---|
| 4,159,909 | 7/1979 | Wilson | 204/192 M |
| 4,239,611 | 12/1980 | Morrison | 204/298 |
| 4,265,729 | 5/1981 | Morrison | 204/192 R |
| 4,299,678 | 11/1981 | Meckel | 204/192 M |
| 4,324,631 | 4/1982 | Meckel | 204/192 M |
| 4,370,217 | 1/1983 | Funaki | 204/192 M |
| 4,412,907 | 11/1983 | Ito et al. | 204/298 |
| 4,414,087 | 11/1983 | Meckel | 204/298 |
| 4,431,505 | 2/1984 | Morrison | 204/298 |
| 4,487,675 | 12/1984 | Meckel | 204/192 R |

OTHER PUBLICATIONS

Hunter et al., IBM Tech. Disc. Bull., 20, (1977), p. 550y.

Primary Examiner—Arthur P. Demers
Attorney, Agent, or Firm—Schiller & Pandiscio

[57] ABSTRACT

An improved sputtering apparatus is provided in which the target assembly is a plurality of permanent magnets, e.g., samarium cobalt magnets.

18 Claims, 2 Drawing Figures

PLANAR MAGNETRON CATHODE TARGET ASSEMBLY

This invention relates to sputtering devices and more particularly to an improved planar magnetron sputtering apparatus.

BACKGROUND ART

Planar sputtering magnetrons are well known in the art, as exemplified by see U.S. Pat. No. 4,200,510 and the references cited therein, and the text, B. Chapman, Glow Discharge Processes, pp. 260–270, J. Wiley & Sons (1980).

Planar sputtering magnetrons generally comprise an anode assembly and a rectangular cathode assembly spaced from the anode assembly and having one or more consumable metal target members. The anode and cathode assemblies are disposed in a vacuum chamber into which a non-oxidizing gas, such as argon, is introduced. A magnetic field is generated across the cathode assembly which is subjected to a negative voltage sufficient to ionize the gas atoms and impel them against the target member(s), causing surface portions of the target member(s) to be sputtered and in turn to be deposited as a film on a substrate positioned proximate to the cathode assembly. The magnetic field is used to enhance ionizaton of the gas at lower voltages.

In manufacturing planar magnetron sputtering equipment it has been recognized that the useful life of the consumable cathode assembly is limited because of a "race track" erosion phenomenon. The term "race track" is used because the applied magnetic field tends to restrict the sputtering erosion of the target to an area in the form of a flat oval.

OBJECTS AND SUMMARY OF THE INVENTION

A primary object of this invention is to provide an improved consumable cathode assembly for use in a planar magnetron sputtering apparatus.

A more specific object of the invention is to provide a consumable cathode assembly which is arranged so as to minimize or effectively avoid the so-called "race track" erosion effect on the target.

Still another object is to provide a new planar magnetron cathode assembly in which the target comprises the means for generating the magnetic field.

A further object is to provide a new consumable cathode assembly which employs a novel arrangement of magnetic members for enhancing the sputtering of metallic material.

Still another object is to provide a cathode assembly which employs a material of high magnetic permeability for enhancing the sputtering of metallic material without magnetic saturation.

A more specific object is to provide a new cathode assembly for a planar magnetron sputtering apparatus that is characterized by a target that includes the means for generating a magnetic field as required for enhancing ionization in the glow discharge of an oxidizing and/or non-oxidizing gas.

A further object of the invention is to provide an improved planar magnetron sputtering system which is more efficient than prior systems.

These and other objects are achieved by a sputtering apparatus that includes (1) an anode assembly, (2) a cathode assembly that comprises an electrically-conductive and heat-conductive base member that is non-magnetic, a magnetic member engaging one portion of the base member, and a target assembly engaging another portion of said base member, said target assembly comprising a plurality of magnetic members disposed in a predetermined mosaic array, and (3) means for applying an electrical potential across said cathode and anode assemblies. Preferably and more specifically, the cathode assembly comprises a non-magnetic and electrically conductive base member in the form of a hat having a tubular side wall, a top end wall, and a bottom flange, a magnetic member installed against the top end wall of the base member, dielectric means surrounding the side wall of the base member, a non-magnetic electrically-conductive plate closing off the bottom of the hat-shaped base member, means for circulating a cooling fluid through the interior of the hat-shaped base member, and a target in the form of an array of permanent magnets attached to the top end wall of the base member in magnetic flux coupled relation to said magnetic member. Preferably the anode assembly is water-cooled and of annular form, and is attached to the cathode assembly in proximity to the target.

Other features and advantages of the invention are set forth in or rendered obvious by the following detailed description of the invention.

DESCRIPTION OF THE PREFERRED EMBODIMENT

Figure 1:
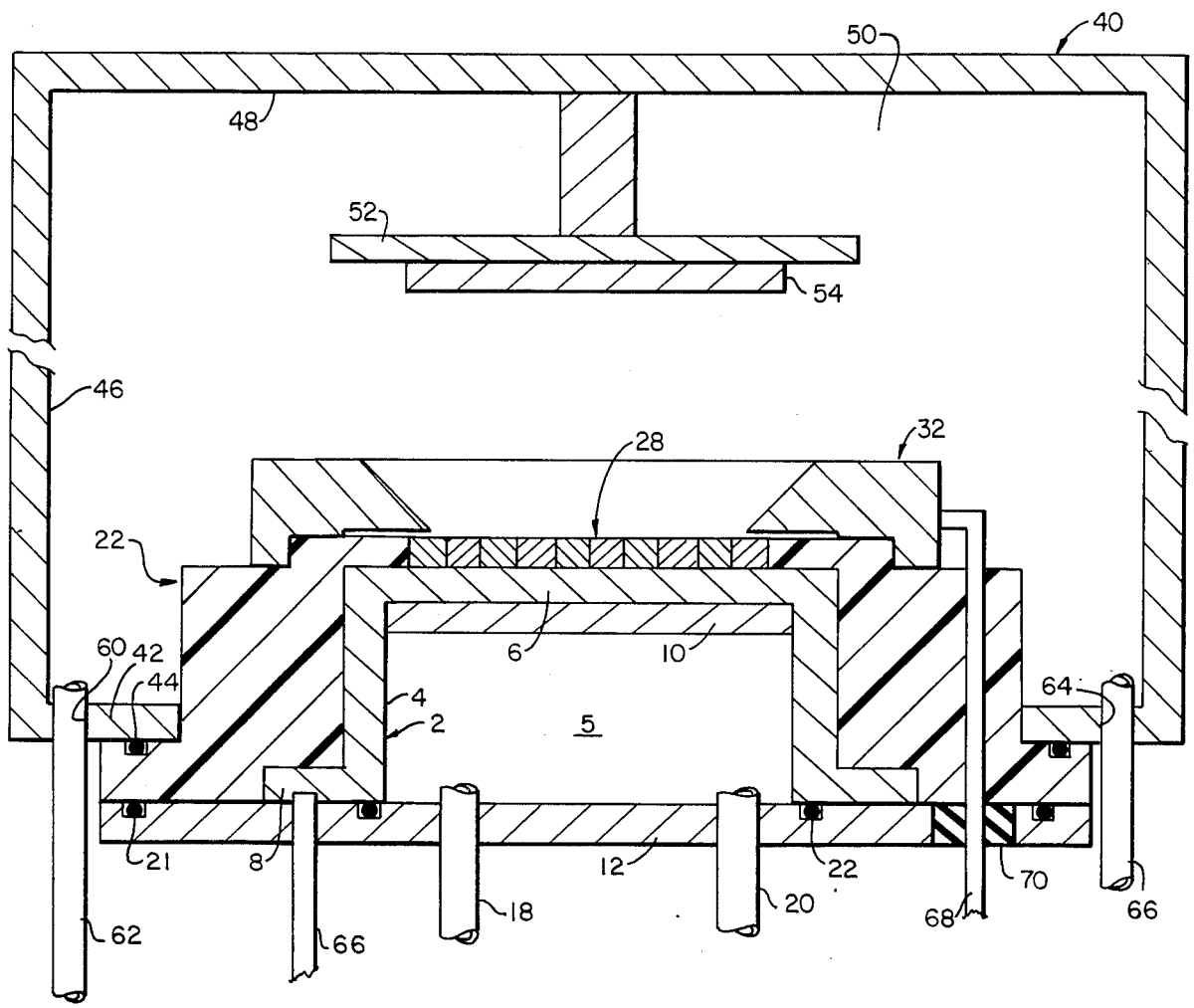
FIG. 1 is a cross-sectional view of a planar magnetron sputtering apparatus employing the present invention.
Figure 2:
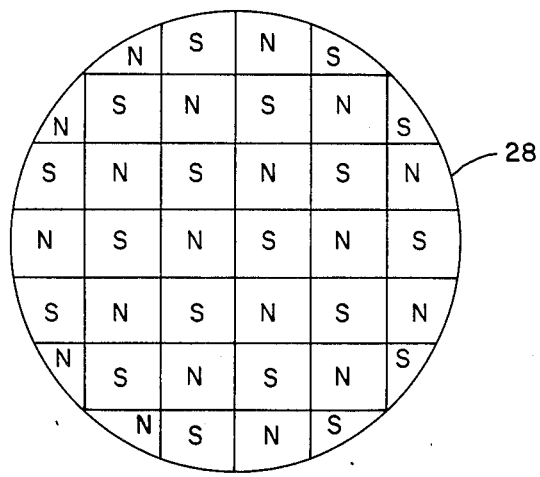
FIG. 2 is a plan view of the target assembly of the same apparatus.

Referring to FIGS. 1 and 2, the illustrated sputtering apparatus comprises a hat shaped non-magnetic, electrically-conductive metal housing 2 comprising a cylindrical side wall 4, a flat top end wall 6, and a peripheral bottom flange 8. Preferably housing 2 is made of copper. Secured within housing 2 in fixed contact with end wall 6 is a magnetic metal member 10. Preferably member 10 is a plate made of iron or soft steel.

The bottom end of housing 2 is closed off by a non-magnetic, electrically conductive metal plate 12. Preferably plate 12 is made of aluminum or a suitable non-magnetic stainless steel. Plate 12 has two openings in which are attached suitable conduits 18 and 20 that may be coupled to a source of cooling fluid, e.g., water (not shown), so as to circulate cooling fluid through the interior space 5 of housing 2. The foregoing elements 2, 10 and 12 form a cathode assembly.

Surrounding housing 2 is a dielectric shroud 22 having a flange 24 that overlies plate 12. Shroud 22 is shaped so as to overlie and engage flange 8 of housing 2, as shown. Means (not shown, such as welding or mechanical fasteners) are used to secure housing 2 to shroud 22. Preferably as shown in FIG. 1, O-ring type seals 21 and 23 are interposed in grooves in plate 12 so as to make hermetic seals between that plate and housing 2 and shroud 22.

Overlying the upper end wall 6 of housing 2 is a mosaic array of permanent magnets shown generally at 28 that serves (a) as the source of the required magnetic field and (b) also as the sputtering target. The composition of magnets 28 may vary, depending upon the metal or metals to be sputtered onto the substrates or work pieces 54. Thus the magnets may comprise one or more of the following chemical elements: chromium, samarium, cobalt, nickel, iron, francium and niobium. Further, by way of example, the magnets 28 may consist of or essentially comprise samarium and cobalt if it is desired to sputter and deposit those metals.

Magnets 28 may be secured to housing 2 in various ways, e.g., by a heat-resistant cement, by metal fasteners or by other suitable retaining means. The array of magnets may form a square, rectangular or other shape, e.g., a circular or oval configuration. Magnets 28 are polarized vertically as viewed in FIG. 1, i.e., their north and south poles are disposed along axes extending at a right angle to the plane of plate 12. Also, as seen in FIG. 2, the magnets are arranged so that the north pole of one magnet is adjacent the south pole of each adjacent magnet. Preferably magnets 28 are square as shown, but they may have some other shape, e.g., rectangular or circular. Magnets 28 are effectively shunted by magnetic member 10. The number and size of the magnets are selected so as to create a magnetic field of between about 300 gauss and 800 gauss above the target assembly. By way of example but not limitation, the magnets may be squares measuring 1-2 inches on each side and $\frac{1}{4}$-$\frac{1}{2}$ inch thick.

An anode assembly 32 is secured to the foregoing cathode assembly. Anode assembly 32 is attached (by means not shown) to dielectric shroud 22 in surrounding but spaced relation to the array of magnets 28. Anode assembly 32 may be configured so as to be similar in shape to the outer edge configuration of the array of magnets 28. Preferably, but not necessarily, the inner edge of anode assembly 32 is formed with a lip section 34 that is spaced from but overlies the outer edge portions of the array of magnets 28 (see FIG. 1). Lip section 34 preferably is arranged so that its inner edge forms a rectangular configuration.

Referring again to FIG. 1, the apparatus also includes a vacuum vessel 40 having an opening which is closed off by insulation shroud 22. Chamber 40 has an end wall 42 that engages flange 24 of shroud 22. Means (not shown) serve to secure shroud 22 and plate 12 to end wall 42.

Vacuum vessel 40 has a side wall 46 and a second end wall 48, which co-act with end wall 42 to define a vacuum chamber 50. A suitable sealing means, e.g., an O-ring as shown at 44, provides an hermetic seal between vessel 40 and shroud 22.

Located within chamber 50 is a fixed support assembly 52 for supporting one or more substrates 54 that are to be coated with a thin film of metal eroded and projected from target members 28. Although not shown, it is to be understood that vessel 40 has a port through which work pieces 54 may be mounted to and removed from a work support 52 described below. The interior chamber 50 is provided with an exhaust port 60 in which is secured an exhaust line 62. The latter is connected to a suitable vacuum pump or other suitable vessel evacuating means (not shown), whereby chamber 50 may be evacuated to a suitable vacuum level, e.g., $7 \times 10^{-5}$ torr. Vacuum vessel 40 also may have an inlet port 64 fitted with an inlet line 66 whereby a suitable ionizable sputtering gas such as argon may be supplied to chamber 50.

The cathode and anode assemblies are adapted to be coupled to a suitable source of electrical potential. Thus the cathode assembly comprising housing 2 and plate 10, together with the permanent magnet target members 28, is electrically attached to an electrically-conductive wire or cable 66 that passes through conductive plate 12 and is adapted to be connected to the negative terminal of a d.c. power supply or an Rf source, while the anode assembly 32 is connected to the positive terminal of a d.c. power supply or an Rf source, by an electrically conductive wire or cable 68 that passes through shroud 22 and an electrically insulating bushing 70 in plate 12. By way of example, the anode assembly 32 may be at a potential of 0 volts, while the cathode assembly may be connected to a d.c. potential of between $-250$ and $-700$ volts, or alternatively the cathode assembly may be at a potential of 0 volts while the anode may be at a potential of $+50$ volts. Further by way of example, a 3 kw Rf source may be connected across the anode and cathode assemblies.

Following is an example of how the apparatus is used.

One or more semiconductor work pieces, e.g., a silicon substrate or wafer 54, are attached to work-support assembly 52 in vessel 40, as shown in FIG. 1. The magnets 28 essentially comprise samarium cobalt and each of them is a square measuring 1 inch on each side and $\frac{1}{2}$ inch thick. The number and the size of the magnets is such as to create a magnetic field of about 300 to about 800 gauss above the target assembly.

After a predetermined vacuum level, e.g., about $7 \times 10^{-5}$ torr, has been established in chamber 50, an inert gas such as argon is infiltrated into the vessel 40 via line 66. The amount of inert gas is limited so as to keep the pressure in vacuum chamber 50 at approximately $1 \times 10^{-2}$ torr. Thereafter a d.c. voltage is applied between the cathode and anode assemblies via lines 66 and 68 so as to set up a glow discharge between the two assemblies.

In this example, the cathode assembly may be at a potential of between about $(-)$ 250 and $(-)$ 700 volts dc, while the anode assembly may be at a potential of 0.0 volts dc. Under the foregoing conditions, the argon gas is ionized. However, the argon atoms become trapped in the magnetic field and are accelerated therewithin and impelled against the exposed surfaces of the magnets 28, causing the surfaces of those magnets to be sputtered and form a vapor. The vaporized metal molecules from magnets 28 are propelled away from the target assembly and strike the exposed face of substrate 54, causing the vaporized metal material to be condensed on the substrate as a thin film (not shown).

The invention is capable of a number of variations. Thus, for example, the anode and cathode assemblies may be circular, rectangular or square in plan view.

The advantages of this invention are many. Thus, for example, the invention may utilize magnets of different compositions to serve as the sputtering targets. Also the anode and cathode assemblies may be modified so as to include internal passageways or conduits (not shown) for a cooling fluid such as water, so as to better control the temperature of the anode and cathode assemblies by circulation of a cooling fluid.

What is claimed is:

1. A sputtering apparatus having a cathode assembly that comprises:
    an electrically-conductive, non-magnetic member;
    a target assembly engaging one portion of said electrically-conductive, non-magnetic member, said target assembly comprising a plurality of permanent magnets disposed in a predetermined array; and
    a magnetic member engaging another portion of said electrically-conductive, non-magnetic member and spaced from said target assembly by said electrically-conductive, non-magnetic member.

2. A sputtering apparatus according to claim 1 wherein said target assembly comprises permanent magnets containing at least one member of the class consisting of chromium, samarium, cobalt, nickel, francium, niobium and iron.

3. A sputtering apparatus according to claim 1 wherein said cathode assembly includes a dielectric shroud surrounding a portion of said electrically-conductive non-magnetic member.

4. A sputtering apparatus according to claim 1 wherein said electrically-conductive, non-magnetic member is made of copper.

5. A sputtering apparatus according to claim 1 further including an anode assembly attached to said cathode assembly in proximity to but spaced from said target assembly.

6. A sputtering apparatus according to claim 5 wherein said anode assembly is spaced from said cathode assembly by a dielectric member.

7. A sputtering apparatus according to claim 3, further including an anode assembly in proximity to said dielectric shroud and said cathode assembly.

8. A sputtering apparatus according to claim 1 wherein said electrically-conductive, non-magnetic member is hat-shaped, and said anode assembly overlies the perimeter of said target assembly and is isolated electrically from said cathode assembly.

9. A sputtering apparatus according to claim 8 wherein said electrically-conductive, non-magnetic member comprises a tubular side wall portion and an end wall portion, and further including a magnetic member, said magnetic member being located on one side of said end wall portion and said array of permanent magnets being located on the opposite side of said end wall portion.

10. A sputtering apparatus according to claim 5 further including a vacuum chamber attached to said cathode assembly, said vacuum chamber surrounding said anode assembly and electrically isolated from said anode assembly.

11. A sputtering apparatus according to claim 10 further including means for applying an electrical potential across said cathode and anode assemblies.

12. A sputtering apparatus according to claim 1 wherein said electrically-conductive, non-magnetic member is in the form of a hat having a tubular side wall, a top end wall, and a bottom flange, and further including a magnetic member engaging one side of the top end wall of said first non-magnetic member, dielectric means surrounding said side wall, an electrically-conductive, non-magnetic plate attached to said flange and coacting with said tubular side wall and said end wall so as to define a closed chamber, and means for circulating a cooling fluid through said chamber, said target assembly being attached to said top end wall in magnetic flux-coupled relation to said magnetic member.

13. A sputtering apparatus according to claim 12 further including means for circulating a cooling fluid so as to cool said cathode assembly 14. A sputtering apparatus according to claim 13 wherein said anode assembly is of rectangular form.

15. A sputtering apparatus according to claim 14 wherein said cathode assembly is attached to a vacuum vessel, and further wherein said anode assembly is disposed within said vacuum vessel, and further including insulation means electrically separating said anode assembly from said cathode assembly.

16. A sputtering apparatus according to claim 1 wherein said permanent magnets are disposed in side-by-side relation and so that the north pole of one magnet is proximate to the south pole of each adjacent magnet.

17. A sputtering apparatus according to claim 16 wherein said magnets are polarized and arranged so that their north and south poles are aligned along lines extending parallel to the longitudinal axis of said cathode and anode assemblies.

18. A sputtering apparatus having a cathode assembly that comprises:

an electrically-conductive, non-magnetic member defining a chamber;

a target assembly engaging one portion of said electrically-conductive, non-magnetic member, said target assembly comprising a plurality of permanent magnets disposed in a predetermined array;

a dielectric shroud surrounding a portion of said non-magnetic member;

an anode assembly attached to said cathode assembly in proximity to but spaced from said target assembly; and means for circulating a cooling fluid through said chamber.

* * * * *